United States Patent
Tomiha et al.

(10) Patent No.: US 10,698,047 B2
(45) Date of Patent: Jun. 30, 2020

(54) MAGNETIC RESONANCE IMAGING APPARATUS AND RADIO FREQUENCY COIL

(71) Applicant: Toshiba Medical Systems Corporation, Otawara-shi (JP)

(72) Inventors: Sadanori Tomiha, Nasushiobara (JP); Koji Akita, Minato (JP); Hideo Kasami, Minato (JP); Kazuya Okamoto, Saitama (JP)

(73) Assignee: Canon Medical Systems Corporation, Otawara-shi (JP)

( * ) Notice: Subject to any disclaimer, the term of this patent is extended or adjusted under 35 U.S.C. 154(b) by 492 days.

(21) Appl. No.: 14/626,048

(22) Filed: Feb. 19, 2015

(65) Prior Publication Data
US 2015/0253394 A1 Sep. 10, 2015

(30) Foreign Application Priority Data

Mar. 7, 2014 (JP) ................................ 2014-045644

(51) Int. Cl.
*G01R 33/36* (2006.01)
*G01R 33/34* (2006.01)

(52) U.S. Cl.
CPC ..... *G01R 33/3692* (2013.01); *G01R 33/3657* (2013.01)

(58) Field of Classification Search
CPC ............ G01R 33/3692; G01R 33/3607; G01R 33/3642; G01R 33/3657; G01R 33/365
See application file for complete search history.

(56) References Cited

U.S. PATENT DOCUMENTS

| 7,635,982 | B2 * | 12/2009 | Adachi | .............. | G01R 33/3692 324/318 |
| 2009/0012387 | A1 * | 1/2009 | Hanson | .................. | A61B 5/055 600/411 |
| 2009/0058420 | A1 * | 3/2009 | Adachi | .............. | G01R 33/3692 324/322 |

(Continued)

FOREIGN PATENT DOCUMENTS

| JP | 2006-297067 A | 11/2006 |
| JP | 2010-029644 A | 2/2010 |

*Primary Examiner* — Rishi R Patel
(74) *Attorney, Agent, or Firm* — Oblon, McClelland, Maier & Neustadt, L.L.P.

(57) ABSTRACT

A magnetic resonance imaging apparatus according to an embodiment includes a radio frequency coil and a control signal transmitting unit. The radio frequency coil is that receives a magnetic resonance signal emitted from a patient as a result of an application of a radio frequency magnetic field thereto and to transmit the received magnetic resonance signal via a wireless communication. The control signal transmitting unit that transmits control information that collectively defines operations to be performed by the radio frequency coil during a predetermined repetition time period, to the radio frequency coil via a wireless communication, prior to the start of the operations performed during the predetermined repetition time period. Further, the radio frequency coil that receives the control information via a wireless communication and to perform the operations on the basis of the received control information.

8 Claims, 4 Drawing Sheets

(56) References Cited

U.S. PATENT DOCUMENTS

| | | | |
|---|---|---|---|
| 2010/0117649 A1* | 5/2010 | Nakanishi | G01R 33/3692 324/318 |
| 2011/0101977 A1* | 5/2011 | Nakanishi | G01R 33/3692 324/307 |
| 2011/0109316 A1* | 5/2011 | Akita | G01R 33/3607 324/322 |
| 2011/0227571 A1* | 9/2011 | Sekiguchi | G01R 33/3607 324/307 |
| 2011/0227574 A1* | 9/2011 | Akita | G01R 33/3692 324/322 |
| 2013/0069644 A1* | 3/2013 | Cho | G01R 33/36 324/309 |
| 2013/0342198 A1* | 12/2013 | Vester | G01R 33/3692 324/307 |

\* cited by examiner

MAGNETIC RESONANCE IMAGING APPARATUS AND RADIO FREQUENCY COIL

CROSS-REFERENCE TO RELATED APPLICATIONS

This application is based upon and claims the benefit of priority from Japanese Patent Application No. 2014-45644, filed on Mar. 7, 2014, the entire contents of all of which are incorporated herein by reference.

FIELD

Embodiments described herein relate generally to a magnetic resonance imaging apparatus and a radio frequency coil.

BACKGROUND

A magnetic resonance imaging apparatus (hereinafter, "MRI apparatus") is configured to emit a radio frequency (RF) pulse onto an examined subject (hereinafter, "patient") and to receive echo signals emitted from the patient upon receiving the RF pulse, with the use of a reception-purpose RF coil. Further, the MRI apparatus is configured to generate a cross-sectional image of the patient by analyzing the received echo signals.

In a conventional example, an image is generated by using a plurality of reception-purpose RF coils. In that situation, each of the reception-purpose RF coils is individually connected to the apparatus main body. The larger the number of connected reception-purpose RF coils is, the larger the number of connection cables is, and the more complicated handling of the reception-purpose RF coils becomes. For this reason, it is desirable to configure the reception-purpose RF coils to operate wirelessly.

To configure the reception-purpose RF coils to operate wirelessly, it is necessary not only to transfer the received echo signals to the apparatus main body side via a wireless communication, but also to control operations of the reception-purpose RF coils themselves via a wireless communication. For this reason, various techniques that can be used for controlling the operations of the reception-purpose RF coils via a wireless communication have been proposed.

DETAILED DESCRIPTION

A magnetic resonance imaging apparatus according to an embodiment includes a radio frequency coil and a control signal transmitting unit. The radio frequency coil is configured to receive a magnetic resonance signal emitted from a patient as a result of an application of a radio frequency magnetic field thereto and to transmit the received magnetic resonance signal via a wireless communication. The control signal transmitting unit is configured to transmit control information that collectively defines operations to be performed by the radio frequency coil during a predetermined repetition time period, to the radio frequency coil via a wireless communication, prior to the start of the operations performed during the predetermined repetition time period. Further, the radio frequency coil is configured to receive the control information via a wireless communication and to perform the operations on the basis of the received control information.

Exemplary embodiments of a magnetic resonance imaging apparatus and a radio frequency coil will be explained below, with reference to the accompanying drawings.

First Embodiment

Figure 1:
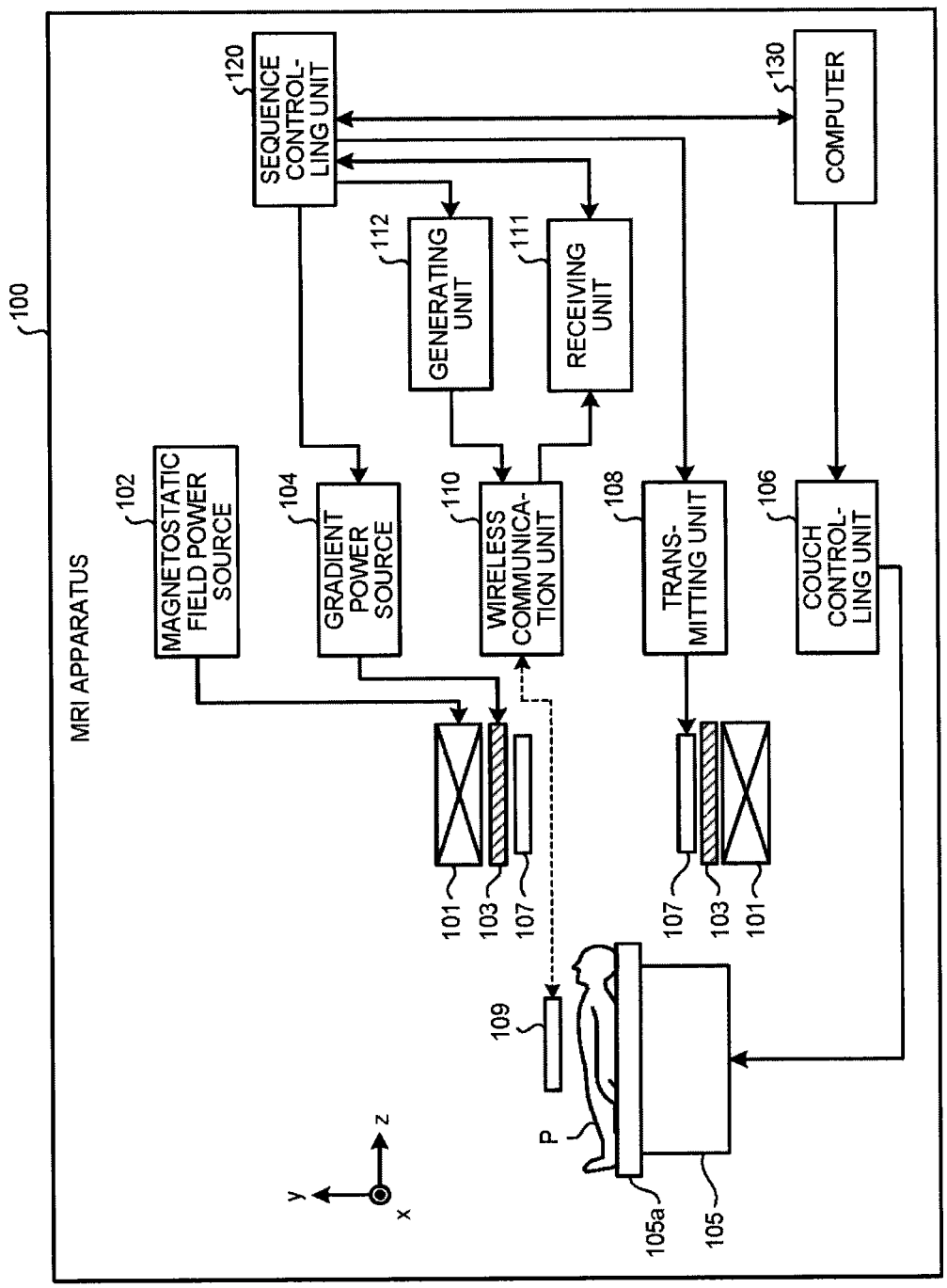
FIG. 1 is a functional block diagram of an MRI apparatus 100 according to a first embodiment.

FIG. 1 is a functional block diagram of a Magnetic Resonance Imaging (MRI) apparatus 100 according to a first embodiment. In the following sections, magnetic resonance imaging apparatuses will be referred to as MRI apparatuses.

As illustrated in FIG. 1, the MRI apparatus 100 includes a magnetostatic field magnet 101, a magnetostatic field power source 102, a gradient coil 103, a gradient power source 104, a couch 105, a couch controlling unit 106, a whole body (WB) coil 107, a transmitting unit 108, a reception coil 109, a wireless communication unit 110, a receiving unit 111, a generating unit 112, a sequence controlling unit 120, and a computer 130. The MRI apparatus 100 does not include an examined subject (such as a human body; hereinafter, "patient") P. The configuration illustrated in FIG. 1 is merely an example.

The magnetostatic field magnet 101 is a magnet formed in the shape of a substantially hollow circular cylinder and is configured to generate a magnetostatic field in the space on the inside thereof. The magnetostatic field magnet 101 may be configured by using, for example, a superconductive magnet and is configured to be excited by receiving a supply of electric current from the magnetostatic field power source 102. The magnetostatic field power source 102 is configured to supply the electric current to the magnetostatic field magnet 101. Alternatively, the magnetostatic field magnet 101 may be configured by using a permanent magnet. In that situation, the MRI apparatus 100 does not need to include the magnetostatic field power source 102. Further, the magnetostatic field power source 102 may be provided separately from the MRI apparatus 100.

The gradient coil 103 is a coil formed in the shape of a substantially hollow circular cylinder and is disposed on the inside of the magnetostatic field magnet 101. The gradient coil 103 is formed by combining three coils corresponding to x-, y-, and z-axes that are orthogonal to one another. These three coils individually receive a supply of electric current from the gradient power source 104 and generate gradient magnetic fields of which the magnetic field intensities change along the x-, y-, and z-axes. The gradient magnetic fields on the x-, y-, and z-axes that are generated by the gradient coil 103 correspond to, for example, a slice encoding gradient magnetic field $G_{SE}$ (or a slice selecting gradient magnetic field $G_{SS}$), a phase encoding gradient magnetic field $G_{ET}$, and a frequency encoding gradient magnetic field $G_{RO}$, respectively. The gradient power source 104 is configured to supply the electric current to the gradient coil 103.

The couch 105 includes a couchtop 105a on which the patient P is placed. Under control of the couch controlling unit 106, while the patient P is placed thereon, the couchtop 105a is inserted into the hollow (i.e., an image taking opening) of the gradient coil 103. Normally, the couch 105 is provided so that the longitudinal direction thereof extends parallel to the central axis of the magnetostatic field magnet 101. Under control of the computer 130, the couch controlling unit 106 is configured to drive the couch 105 so that the couchtop 105a moves in longitudinal directions and in up-and-down directions.

The WB coil 107 is provided on the inside of the gradient coil 103 and is configured to generate a radio frequency magnetic field by receiving a supply of a radio frequency (RF) pulse from the transmitting unit 108. The transmitting unit 108 is configured to supply the RF pulse corresponding to a Larmor frequency determined by the type of targeted atoms and the magnetic field intensities, to the WB coil 107.

The reception coil 109 is configured to receive magnetic resonance signals (hereinafter, "MR signals", as necessary). For example, the reception coil 109 is a radio frequency coil attached to the patient and is configured with a surface coil to be attached to the body surface of the patient or a Phased Array Coil (PAC) structured with a plurality of surface coils.

In this situation, the reception coil 109 according to the first embodiment is configured to transmit the received MR signals via a wireless communication. For example, when having received the MR signals, the reception coil 109 transmits the received MR signals to the wireless communication unit 110 provided on the main body side of the MRI apparatus 100 via a wireless communication. The wireless communication unit 110 outputs the MR signals received from the reception coil 109 to the receiving unit 111.

In the first embodiment, an example will be explained in which the WB coil 107 is a transmission-purpose RF coil, whereas the reception coil 109 is a reception-purpose RF coil; however, possible embodiments are not limited to this example. In another example, the reception coil 109 may be a transmission/reception purpose RF coil, such as a head coil, that further has a function of transmitting an RF pulse. In other words, it is sufficient if the reception coil 109 is a radio frequency coil that has at least the receiving function and the wireless communication function. Further, an RF coil configured to transfer the MR signals via a wired communication may be used together, separately from the reception coil 109. Further, the WB coil 107 may have a function of receiving the MR signals and may receive the MR signals emitted from the patient P and output the received MR signals to the receiving unit 111. In that situation, the communication between the WB coil 107 and the receiving unit 111 is realized by a wired communication.

The receiving unit 111 is configured to detect the MR signals output from the wireless communication unit 110 and to generate MR data on the basis of the detected MR signals. More specifically, the receiving unit 111 generates the MR data by applying a digital conversion to the MR signals output from the wireless communication unit 110. Further, the receiving unit 111 is configured to transmit the generated MR data to the sequence controlling unit 120.

The generating unit 112 is configured to generate control information that defines operations to be performed by the reception coil 109 during a time period specified by using a repetition time period as the smallest unit. Processes performed by the generating unit 112 will be explained later.

The sequence controlling unit 120 is configured to perform an image taking process on the patient P, by driving the gradient power source 104, the transmitting unit 108, and the receiving unit 111, on the basis of sequence information transmitted from the computer 130. In this situation, the sequence information is information that defines a procedure for performing the image taking process. The sequence information defines: the intensity of the electric current to be supplied to the gradient coil 103 and the timing with which the electric current is to be supplied; the strength of the RF pulse to be supplied by the transmitting unit 108 to the WB coil 107 and the timing with which the RF pulse is to be applied; the timing with which the MR signals are to be detected by the receiving unit 111, and the like. For example, the sequence controlling unit 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, when having received MR signal data from the receiving unit 111 as a result of the image taking process performed on the patient P by controlling the gradient power source 104, the transmitting unit 108, the receiving unit 111, and the generating unit 112, the sequence controlling unit 120 transfers the received MR signal data to the computer 130.

The computer 130 is configured to exercise overall control of the MRI apparatus 100, to generate an MR image, and the like. For example, on the basis of an image taking condition input by an operator, the computer 130 causes the sequence controlling unit 120 to execute an image taking sequence. Further, on the basis of the MR signal data transmitted from the sequence controlling unit 120, the computer 130 reconstructs an image. The computer 130 may have the reconstructed image stored into a storage unit or displayed by a display unit. The computer 130 is configured with, for example, an information processing apparatus such as a computer apparatus.

When the RF coil (the reception coil 109) configured to transmit the MR signals to the receiving unit 111 via a wireless communication is used, signals used for controlling various types of operations of the RF coil are transmitted to the RF coil via a wireless communication.

For example, during the reception of the MR signals, an active decoupling process may be performed for the purpose of protecting the reception-purpose RF coil from the transmission RF pulse. The active decoupling process is performed, for example, by shifting the resonance frequencies of the RF coil elements at the transmission timing of the transmission RF pulse, so as to make it difficult to be impacted by the power of the transmission RF pulse. In that situation, control signals for performing the active decoupling process at the transmission timing of the transmission RF pulse are transmitted from the main body side (e.g., the sequence controlling unit 120 or the like) of the MRI apparatus 100 to the RF coil, so that the active decoupling process is performed at the RF coil.

In this situation, if a wired-type RF coil configured to receive the control signals from the main body side of the MRI apparatus 100 via a wired communication is used, the level of precision of the operations of the RF coil controlled by the control signals is within a tolerable range. For example, a delay in the operations of such a wired-type RF coil is, at most, approximately equal to a delay in the response time of a Positive-Intrinsic-Negative (PIN) diode included in a circuit used for performing the active decoupling process.

In contrast, when a wireless-type RF coil is used, the level of precision of the operations of the RF coil is lowered by various factors. For example, a processing delay of software related to the wireless communication, a delay involved in a re-processing process performed when the signals are wirelessly transferred in units of frames, and a processing delay in protocol stacks are larger than when a wired-type RF coil is used and are not in a tolerable range.

Figure 2:
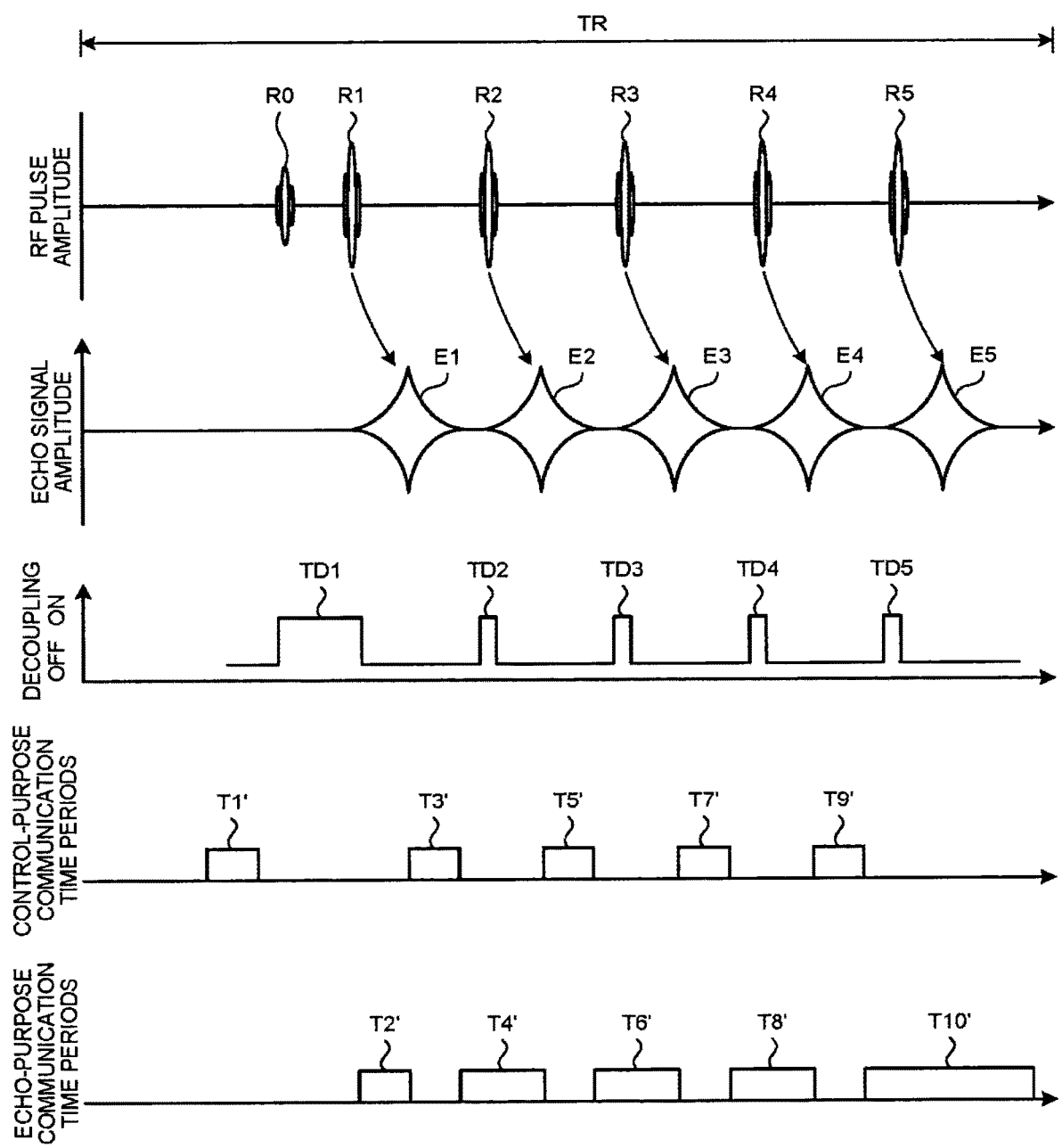
FIG. 2 is a drawing for explaining problems of an RF coil caused by a wireless communication.

FIG. 2 is a drawing for explaining problems of an RF coil caused by a wireless communication. FIG. 2 illustrates an example of operations performed by a wireless-type RF coil. More specifically, FIG. 2 illustrates a relationship among a pulse sequence, operation timing of the active decoupling process, and communication timing in the wireless communication.

In FIG. 2, the horizontal axis expresses time. The "RF pulse amplitude" denotes the timing with which the RF pulses (a 90-degree pulse and 180-degree pulses) are applied. Further, the "echo signal amplitude" denotes timing of echo signals. Further, the "decoupling" denotes operation timing of the active decoupling process. When a rectangular wave is high, it is indicated that the "active decoupling is ON", whereas when a rectangular wave is low, it is indicated that the "active decoupling is OFF". Further, the "control-purpose communication time periods" denote time periods during each of which the RF coil receives a control signal from the main body side of the MRI apparatus 100 via a wireless communication. Further, the "echo-purpose communication time periods" denote time periods during each of which the RF coil transmits an echo signal to the receiving unit 111 via a wireless communication. The duration illustrated in FIG. 2 corresponds to one Repetition Time (TR).

In the example illustrated in FIG. 2, a 90-degree pulse R0 is applied, at first, as an RF excitation pulse. In addition, subsequent to the 90-degree pulse R0, a plurality of 180-degree pulses, namely R1, R2, R3, R4, and R5, are applied at predetermined intervals. Due to the plurality of 180-degree pulses R1, R2, R3, R4, and R5, echo signals E1, E2, E3, E4, and E5 are generated, respectively.

When the active decoupling process is performed on the basis of the pulse sequence described above, an active decoupling circuit operates with timing corresponding to the 90-degree pulse R0 and the 180-degree pulses R1 to R5. More specifically, the active decoupling circuit operates at an operation time TD1 corresponding to the 90-degree pulse R0 and the 180-degree pulse R1 and at operation times TD2, TD3, TD4, and TD5 respectively corresponding to the 180-degree pulses R2, R3, R4, and R5.

In this situation, to cause the active decoupling circuit to operate, control signals are transferred during time periods T1', T3', T5', T7', and T9' that precede the operation times TD1, TD2, TD3, TD4, and TD5, respectively.

However, if any of the various types of delays described above occurs in the processing of the control signals transferred in this manner, there is a possibility that the level of precision of the operations in the active decoupling process may become degraded, and the active decoupling function and/or the reception of the echo signals may be affected.

Further, because the control signals are transferred during the control-purpose communication time periods T1', T3', T5', T7', and T9', there may be a situation in which echo-purpose communication time periods (T2', T4', T6', T8', and T10') become intermittent, and it may not be possible to ensure a sufficient transfer amount of echo signals.

To cope with this situation, the MRI apparatus 100 according to the first embodiment performs the processes described below, to enhance the level of precision of the operations via the wireless communication. In the description below, an example will be explained in which the MRI apparatus 100 controls the operations in the active decoupling process; however, possible embodiments are not limited to this example.

Figure 3:
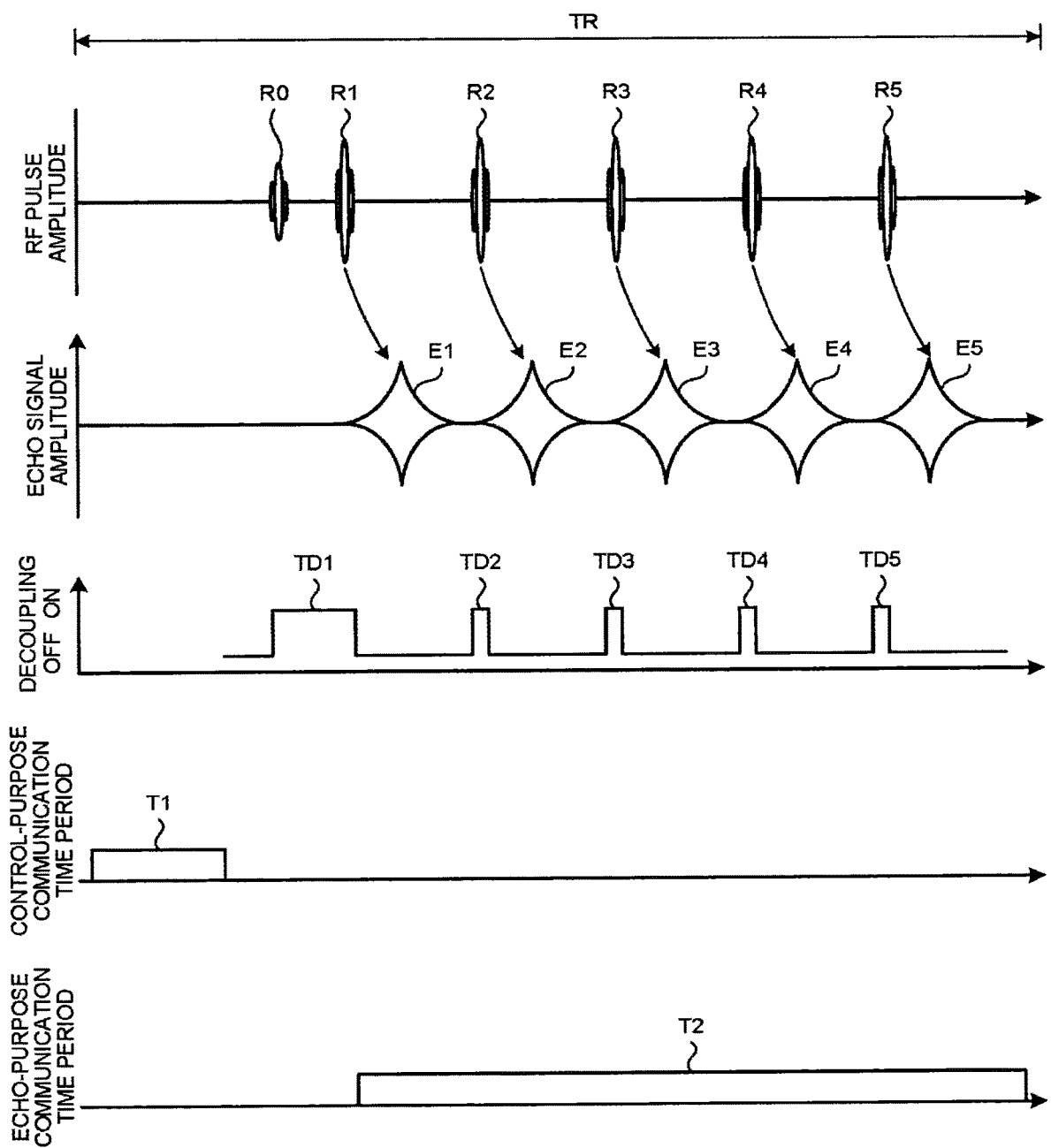
FIG. 3 is a drawing for explaining operation control for the RF coil via a wireless communication according to the first embodiment.

FIG. 3 is a drawing for explaining operation control for the RF coil via a wireless communication according to the first embodiment. FIG. 3 illustrates a relationship among a pulse sequence for a wireless-type RF coil (the reception coil 109), operation timing of the active decoupling process, and communication timing in the wireless communication. In FIG. 3, the explanations of the "RF pulse amplitude", the "echo signal amplitude", the "decoupling", the "control-purpose communication time period", and the "echo-purpose communication time period" are the same as the explanations of the items illustrated in FIG. 2. The duration illustrated in FIG. 3 corresponds to one TR taken out of a series of pulse sequence used for performing an image taking process.

In the example illustrated in FIG. 3, similar to the example in FIG. 2, the 90-degree pulse R0 and the plurality of 180-degree pulses R1, R2, R3, R4, and R5 at predetermined intervals are applied. In addition, due to the 180-degree pulses R1, R2, R3, R4, and R5, the echo signals E1, E2, E3, E4, and E5 are generated, respectively.

Further, the operation timing of the active decoupling circuit is also the same as the operation timing illustrated in FIG. 2. In other words, the active decoupling circuit is caused to operate at the operation time TD1 corresponding to the 90-degree pulse R0 and the 180-degree pulse R1 and at the operation times TD2, TD3, TD4, and TD5 respectively corresponding to the 180-degree pulses R2, R3, R4, and R5.

In this situation, the MRI apparatus 100 according to the first embodiment generates control information that defines the operation times TD1, TD2, TD3, TD4, and TD5 during the one TR illustrated in FIG. 3, on the basis of the pulse sequence. In other words, the control information is information that defines the operations of the reception coil 109 in time series. Further, the MRI apparatus 100 transfers the generated control information to the reception coil 109 during a time period T1. On the basis of the control information transferred from the MRI apparatus 100, the reception coil 109 performs the operations during the one TR. For example, the reception coil 109 causes the active decoupling circuit to operate at each of the operation times TD1, TD2, TD3, TD4, and TD5.

As explained above, the MRI apparatus 100 transfers the control information during the time period T1 prior to the operation times TD1 to TD5. In other words, at least prior to the operation time TD1 of the active decoupling circuit corresponding to the first excitation pulse, the MRI apparatus 100 transfers the control information. Thus, regardless of whether any of the various types of delays described above has occurred or not, the MRI apparatus 100 is able to cause the active decoupling process to be performed at the operation times TD1 to TD5 defined by the control information. Consequently, it is possible to enhance the level of precision of the operations via the wireless communication.

Further, because the MRI apparatus 100 transfers the control information that defines the operations to be performed by the reception coil 109 during the one TR, to the reception coil 109 during the time period T1, it is possible to use a subsequent time period T2 in which the echo signal E1 is generated, as an echo-purpose communication time period. Thus, because the MRI apparatus 100 is able to ensure a sufficient transfer amount of echo signals, it is possible to enhance the level of precision of the operations via the wireless communication.

As explained above, the MRI apparatus 100 is able to enhance the level of precision of the operations via the wireless communication. FIG. 3 illustrates the example of the pulse sequence in which the echo signals are generated by the 90-degree pulse and the 180-degree pulses; however, possible embodiments are not limited to this example. Alternatively, any other pulse sequence may be used. Next, a detailed configuration of the MRI apparatus 100 according to the first embodiment will be explained.

Figure 4:
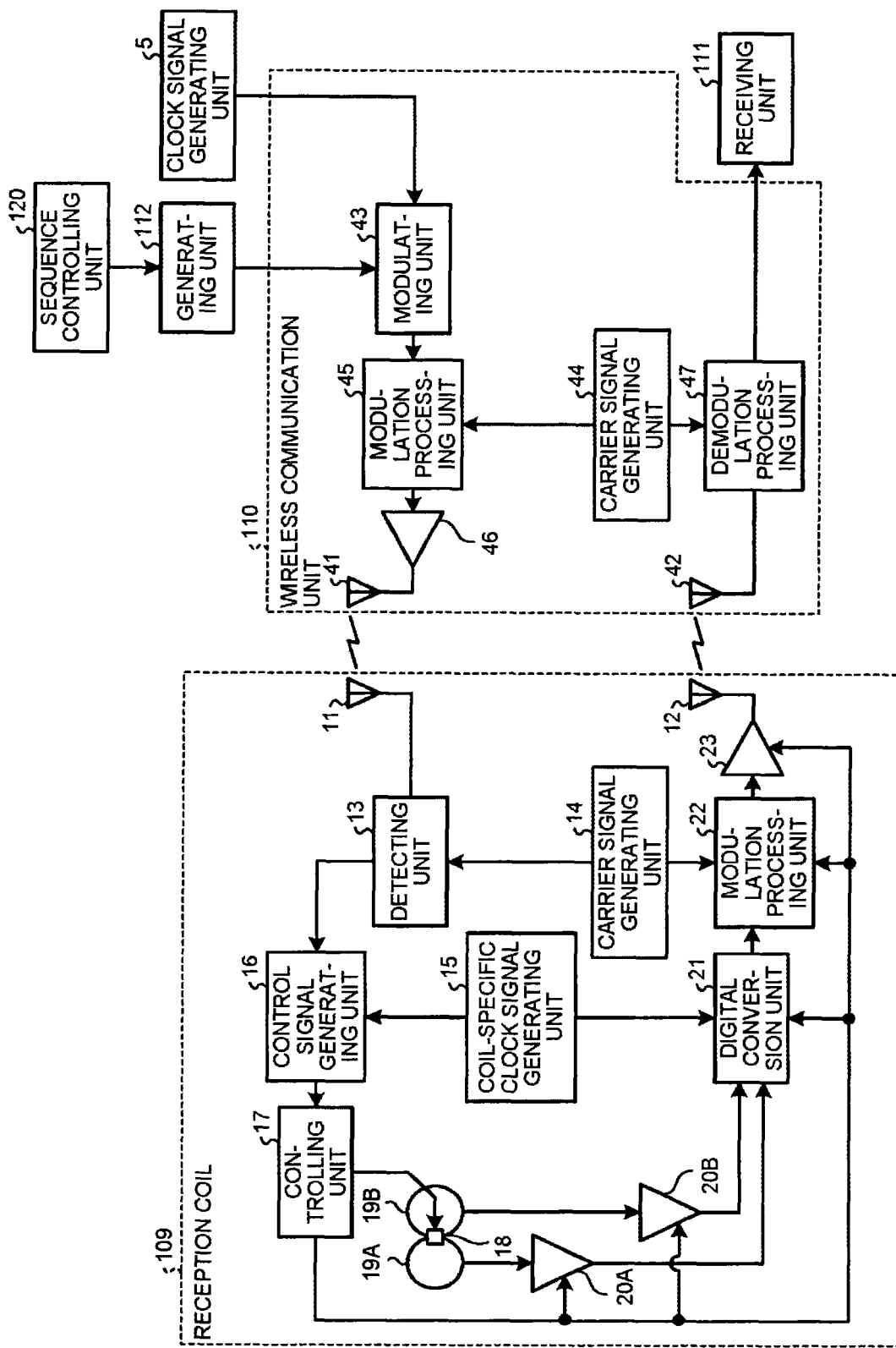
FIG. 4 is a functional block diagram of a detailed configuration of the MRI apparatus 100 according to the first embodiment.

FIG. 4 is a functional block diagram of the detailed configuration of the MRI apparatus 100 according to the first embodiment. As illustrated in FIG. 4, the reception coil 109 includes wireless antennas 11 and 12, a detecting unit 13, a carrier signal generating unit 14, a coil-specific clock signal generating unit 15, a control signal generating unit 16, a controlling unit 17, an active decoupling circuit 18, reception elements 19A and 19B, preamplifiers 20A and 20B, a digital conversion unit 21, a modulation processing unit 22, and an amplifier 23. Further, the wireless communication unit 110 includes wireless antennas 41 and 42, a modulating unit 43, a carrier signal generating unit 44, a modulation processing unit 45, an amplifier 46, and a demodulation processing unit 47.

In this situation, the wireless communication unit 110 operates by receiving a supply of clock signals from a clock signal generating unit 5. The clock signal generating unit 5 is configured to generate a reference clock signal that exhibits amplitude fluctuations repeated at a predetermined frequency. For example, the clock signal generating unit 5 is an oscillator configured by using a quartz crystal resonator and is provided in the computer 130 (not illustrated in FIG. 1).

With reference to FIG. 4, the control exercised over the operations of the active decoupling circuit 18 and the transfer of the echo signals via the wireless communication will be sequentially explained.

<The Control Exercised Over the Operations of the Active Decoupling Circuit 18>

First, the control exercised over the operations of the active decoupling circuit 18 will be explained. The generating unit 112 generates the control information on the basis of the image taking condition. After that, the generating unit 112 transmits the generated control information to the reception coil 109 via a wireless communication, prior to the start of the operations.

For example, the sequence controlling unit 120 determines the type of the transmission RF pulse and the generation timing of the RF pulse, on the basis of the pulse sequence input by an operator of the MRI apparatus 100. In one example, the sequence controlling unit 120 determines the generation timing with which the 90-degree pulse R0 and the plurality of 180-degree pulses R1, R2, R3, R4, and R5 illustrated in FIG. 3 are generated.

Subsequently, the generating unit 112 calculates the operation timing with which the active decoupling circuit 18 is operated, on the basis of the type of the transmission RF pulse and the generation timing of the RF pulses determined by the sequence controlling unit 120. In one example, the generating unit 112 calculates the operation times TD1, TD2, TD3, TD4, and TD5 illustrated in FIG. 3.

After that, the generating unit 112 generates the control information on the basis of the calculated operation times. In one example, the generating unit 112 generates the control information for operating the active decoupling circuit at the operation times TD1, TD2, TD3, TD4, and TD5 illustrated in FIG. 3.

After that, the generating unit 112 transfers the generated control information to the reception coil 109 via the wireless communication unit 110, prior to the operations controlled by the control information are started (e.g., during the time period T1). In this situation, the process performed by the generating unit 112 is not limited to the process described above. For example, in the control information, the generating unit 112 may define operations to be performed in a plurality of TRs, instead of defining only the operations to be performed in the one TR. In other words, the control information is information that defines the operations to be performed during a time period specified by using the TR (Repetition Time) as the smallest unit. Further, the information used by the generating unit 112 for generating the control information is not limited to the information about the pulse sequence. For example, the generating unit 112 may use any other image taking condition (e.g., information about the RF coil being used, information about the image taking site, the slice selecting width, or the like). For example, to transmit the control information to an RF coil positioned in a sensitivity region, the generating unit 112 may transmit the control information only to the reception coil 109 being employed, by using information about the RF coil being employed, information about the image taking site, position information of the RF coil, and/or the like.

In the wireless communication unit 110, the modulating unit 43 is configured to append absolute time information to the control information generated by the generating unit 112, by using the clock signals generated by the clock signal generating unit 5.

The modulation processing unit 45 is configured to generate a control-information transfer-purpose signal by performing a modulating process on the control information to which the absolute time information was appended by the modulating unit 43, by using a carrier frequency generated by the carrier signal generating unit 44. The modulation processing unit 45 is configured to subsequently amplify the control-information transfer-purpose signal by using the amplifier 46 and to transmit the amplified control-information transfer-purpose signal from the wireless antenna 41.

The reception coil 109 is configured to receive the control information via a wireless communication and performs the operations defined by the control information, on the basis of the received control information. For example, the reception coil 109 performs the active decoupling process on the basis of the control information defined by the generating unit 112.

In the reception coil 109, the wireless antenna 11 is configured to receive the control-information transfer-purpose signal transmitted from the wireless antenna 41. The detecting unit 13 is configured to detect the control information from the control-information transfer-purpose signal received by the wireless antenna 11, by using the carrier frequency generated by the carrier signal generating unit 14.

Further, the control signal generating unit 16 is configured to generate the control signals to cause the active decoupling circuit 18 to operate with the operation timing defined by the control information, by using the absolute time information supplied from the coil-specific clock signal generating unit 15.

In this situation, in the same manner as the clock signal generating unit 5 does, the coil-specific clock signal generating unit 15 generates a reference clock signal that exhibits amplitude fluctuations repeated at a predetermined frequency. Further, in the first embodiment, the coil-specific clock signal generating unit 15 and the clock signal generating unit 5 shares the absolute time. In other words, the coil-specific clock signal generating unit 15 shares the same time axis with the clock signal generating unit 5. That is to say, the coil-specific clock signal generating unit 15 generates the reference clock signal by using the same time axis as the one used by the clock signal generating unit 5. Thus, it is possible for the control signal generating unit 16 to generate the control signals with the operation timing defined by the control information generated by the generating unit 112.

The controlling unit 17 sequentially sends the control signals generated by the control signal generating unit 16 to the active decoupling circuit 18. As a result, the active decoupling circuit 18 performs the active decoupling process with the operation timing defined by the control information generated by the generating unit 112. In the example illustrated in FIG. 3, the active decoupling circuit 18 performs the active decoupling process at the operation times TD1, TD2, TD3, TD4, and TD5.

As explained above, the generating unit 112 generates the control information on the basis of the image taking condition. After that, the generating unit 112 transmits the generated control information to the reception coil 109 via the wireless communication, prior to the start of the operations. The reception coil 109 receives the control information via the wireless communication and performs the operations defined by the control information, on the basis of the received control information.

In other words, the generating unit 112 functions as a control signal transmitting unit configured to transmit the control information that collectively defines the operations to be performed by the reception coil 109 during the predetermined repetition time period, to the reception coil 109 via the wireless communication, prior to the start of the operations performed during the predetermined repetition time period. For example, the control signal transmitting unit calculates the operation timing of the active decoupling circuit 18, with respect to a specific time period corresponding to three TRs. After that, the control signal transmitting unit generates the control information for the time period, by defining all the operation times included in the time period together (collectively). Subsequently, the control signal transmitting unit transmits the generated control information to the reception coil 109, prior to the operation times defined by the control information. In this situation, the time period defined in the control information by the control signal transmitting unit does not necessarily have to be three TRs. The defined time period may be any arbitrary time period that is specified by using the TR as the smallest unit.

The Transfer of the Echo Signals Via the Wireless Communication

Next, the transfer of the echo signals via the wireless communication will be explained. In the reception coil 109, the MR signals emitted from the patient P are received by the reception elements 19A and 19B and are amplified by the preamplifiers 20A and 20B. After that, the MR signals received by the reception elements 19A and 19B are input to the digital conversion unit 21.

The digital conversion unit 21 is configured to generate MR data (called a sampling process), by applying an A/D conversion to the input MR signals, while using the clock signals supplied from the coil-specific clock signal generating unit 15.

Subsequently, the modulation processing unit 22 is configured to generate an MR-data transfer-purpose signal by performing a modulating process on the MR data generated by the digital conversion unit 21, while using the carrier frequency generated by the carrier signal generating unit 14. After that, the modulation processing unit 22 is configured to amplify the MR-data transfer-purpose signal by using the amplifier 23 and to transmit the amplified MR-data transfer-purpose signal from the wireless antenna 12.

After that, in the wireless communication unit 110, the wireless antenna 42 is configured to receive the MR-data transfer-purpose signal transmitted from the wireless antenna 12. Subsequently, the demodulation processing unit 47 is configured to demodulate the MR-data transfer-purpose signal received by the wireless antenna 42 into digital MR data, by using the carrier frequency generated by the carrier signal generating unit 44.

After that, the receiving unit 111 is configured to transmit the demodulated MR data to the computer 130, via the sequence controlling unit 120.

In the MRI apparatus 100, the reception coil 109 transfers the echo signals via the wireless communication in the manner described above. The configuration illustrated in FIG. 4 is merely an example. In another example, the reception coil 109 may include a Band-Pass Filter (BPF) for a filtering purpose provided between the preamplifiers 20A, 20B and the digital conversion unit 21. Further, the number of reception elements 19A and 19B does not necessarily have to be two; it is sufficient if at least one of the reception elements is provided.

As explained above, in the MRI apparatus 100 according to the first embodiment, the generating unit 112 generates, on the basis of the image taking condition, the control information that defines the operations to be performed by the reception coil 109 during the time period specified by using the repetition time period as the smallest unit. Further, the generating unit 112 transmits the generated control information to the reception coil 109 via the wireless communication, prior to the start of the operations. The reception coil 109 receives the control information via the wireless communication and performs the operations defined by the control information on the basis of the received control information. Thus, the MRI apparatus 100 makes it possible to enhance the level of precision of the operations via the wireless communication.

For example, in the MRI apparatus 100, the generating unit 112 generates the control information that controls the operations of the active decoupling circuit 18 and transfers the generated control information to the reception coil 109 in advance, at least prior to the operation time of the active decoupling circuit 18 corresponding to the first excitation pulse. After that, in the reception coil 109, the controlling unit 17 causes the active decoupling circuit 18 to perform the operations defined by the transferred control information, on the basis of the clock signal of which the absolute time is shared with the clock signal used on the main body side of the MRI apparatus 100. Thus, regardless of whether any of the various types of delays has occurred or not, the MRI apparatus 100 is able to control the operations of the reception coil 109 with the operation timing defined by the control information.

Further, for example, in the MRI apparatus 100, the generating unit 112 transfers the control information that defines the operations to be performed during the one TR, to the reception coil 109 in advance, prior to the start of the operations. Thus, the reception coil 109 is able to use the time period after the start of the operations as the echo-purpose communication time period. Consequently, the MRI apparatus 100 is able to ensure a sufficient transfer amount of echo signals.

The configuration described above is merely an example. It is not necessary to provide the configuration in the entirety thereof. For example, it is sufficient if the MRI apparatus 100 is provided with the reception coil 109 and the generating unit 112 serving as the control signal transmitting unit. The reception coil 109 receives the magnetic resonance signals emitted from the patient as a result of the application of the radio frequency magnetic field thereto and transmits the received magnetic resonance signals via the wireless communication. The generating unit 112 transmits the control information that collectively defines the operations to be performed by the reception coil 109 during the predetermined repetition time period, to the reception coil 109 via the wireless communication, prior to the start of the operations performed during the predetermined repetition time period. The reception coil 109 receives the control information via the wireless communication and performs the operations on the basis of the received control information.

Other Embodiments

The first embodiment has thus been explained. It is, however, possible to carry out the present disclosure in other various modes.

Control of the Processing Units Other than the Active Decoupling Circuit

For example, in the first embodiment, the example is explained in which the MRI apparatus 100 controls the operations of the active decoupling circuit 18. However, possible embodiments are not limited to this example. For instance, the MRI apparatus 100 may exercise control so as to turn on and off the processing units such as the preamplifiers 20A and 20B, the digital conversion unit 21, the modulation processing unit 22, and the amplifier 23.

In the example illustrated in FIG. 3, it is sufficient if these processing units are turned on only during the echo-purpose communication time period T2. Thus, for example, the sequence controlling unit 120 determines the generation times at which the 180-degree pulses R1 to R5 are generated, on the basis of the pulse sequence. After that, the sequence controlling unit 120 determines the generation time periods in which the echo signals E1 to E5 are generated by the 180-degree pulses R1 to R5, respectively. The generating unit 112 calculates the echo-purpose communication time period T2, on the basis of the generation time periods of the echo signals E1 to E5 determined by the sequence controlling unit 120. Subsequently, the generating unit 112 generates control information so that the processing units such as the preamplifiers 20A and 20B, the digital conversion unit 21, the modulation processing unit 22, and the amplifier 23 are turned on during the calculated echo-purpose communication time period T2 and transfers the generated control information to the reception coil 109. Accordingly, the reception coil 109 exercises control so that the processing units such as the preamplifiers 20A and 20B, the digital conversion unit 21, the modulation processing unit 22, and the amplifier 23 are turned on during the calculated echo-purpose communication time period T2. Thus, the MRI apparatus 100 is able to, for example, reduce the electric power used by the reception coil 109. The reception coil 109 that operates according to the wireless communication usually operates on a battery installed therein. Thus, by reducing the electric power used thereby, it is possible to lower the risk of running out of battery during image taking processes.

Regarding the Control-Purpose Communication Time Period

For example, in the first embodiment, the example is explained in which the generating unit 112 transfers the control information during the time period T1 (FIG. 3); however, possible embodiments are not limited to this example. For instance, the generating unit 112 may transfer the control information during a repetition time period that is earlier than the repetition time period targeted by the control information. In that situation, however, it is desirable to avoid the echo-purpose communication time period in the repetition time period. In other words, the generating unit 112 may transmit the control information during a part of the repetition time period that is earlier than the repetition time period defined by the control information, the part being different from the echo-purpose communication time period.

In other words, the generating unit 112 is able to transfer the control information during any time period other than echo-purpose communication time periods. It should be noted, however, that the generating unit 112 needs to transfer each piece of control information prior to the start of the operations defined by the piece of control information. Accordingly, for example, the generating unit 112 may transfer the control information over a plurality of repetition time periods. Thus, the MRI apparatus 100 is able to transmit the control information prior to the start of the operations, while ensuring a sufficient transfer amount of the echo signals.

According to at least one aspect of the embodiments described above, it is possible to enhance the level of precision of the operations via the wireless communication.

The exemplary embodiments of the present disclosure have thus been explained. The exemplary embodiments, however, are merely examples and are not intended to limit the scope of the present disclosure. The exemplary embodiments may be carried out in any other various modes, and certain parts thereof may be omitted, replaced, or altered in various manners without departing from the gist of the present disclosure. The exemplary embodiments and modifications thereof are included in the configurations set forth in the claims and the equivalents thereof, in the same manner as those embodiments and modifications would fall within the scope and the gist of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a radio frequency coil that receives a magnetic resonance signal emitted from a patient as a result of an application of a radio frequency magnetic field thereto and transmits the received magnetic resonance signal via a wireless communication;
a generating unit that generates, all in one piece and for each of a plurality of TRs (Repetition Time), control information that defines operations to be performed by the radio frequency coil based on an image taking condition, a plurality of echoes being generated for each of the plurality of TRs, the control information defining a plurality of operation times during each of the plurality of TRs, each of the plurality of operation times corresponding to each of the plurality of echoes generated; and
a wireless communication unit that transmits, via the wireless communication and prior to a start of the operations, the control information generated by the generating unit, wherein the radio frequency coil receives the control information that is generated all in one piece and for each of the plurality of TRs, performs the operations, and performs an echo-purpose communication during a continuous time period including a time period in which an echo is generated, wherein the control information includes operations of an active decoupling circuit to shift a resonance frequency of the radio frequency coil at a transmission timing of a radio frequency pulse and the echo-purpose communication performed during the continuous time period including the time period in which the echo is generated is performed during control of an active decoupling of the radio frequency coil.

2. The magnetic resonance imaging apparatus according to claim 1, wherein the wireless communication unit that transmits the control information during a time period that is different from a time period in which the magnetic resonance signal is transmitted via the wireless communication.

3. The magnetic resonance imaging apparatus according to claim 1, wherein the control information controls operations of a digital conversion unit.

4. The magnetic resonance imaging apparatus according to claim 1, wherein
the radio frequency coil includes a clock signal generating unit that generates a clock signal, and
the clock signal generating unit shares a same time axis with a clock signal generating unit included in a main body of the magnetic resonance imaging apparatus.

5. The magnetic resonance imaging apparatus according to claim 1, wherein, when two or more of the radio frequency coils are provided, the wireless communication unit transmits the control information to a predetermined one or more of the radio frequency coils.

6. The magnetic resonance imaging apparatus according to claim 1, wherein the control information controls operations of at least one selected from the following: a preamplifier; a modulation processing unit that transmits the magnetic resonance signal; or an amplifying circuit provided on a stage subsequent to the modulation processing unit.

7. The magnetic resonance imaging apparatus according to claim 1, wherein the control information defining the plurality of operation times during each of the plurality of TRs comprises a plurality of absolute times.

8. A radio frequency coil comprising:
a reception element that receives a magnetic resonance signal emitted from a patient as a result of an application of a radio frequency magnetic field thereto;
a wireless communication unit that receives, via a wireless communication and prior to a start of the operations to be performed by the radio frequency coil, control information that defines the operations to be performed by the radio frequency coil, the control information being generated based on an image taking condition and being generated all in one piece and for each of a plurality of TRs (Repetition Time) and that transmits the magnetic resonance signal received by the reception element via the wireless communication, a plurality of echoes being generated for each of the plurality of TRs, the control information defining a plurality of operation times during each of the plurality of TRs, each of the plurality of operation times corresponding to each of the plurality of echoes; and
a controlling unit that controls the operations on a basis of the control information,
wherein the radio frequency coil performs an echo-purpose communication during a continuous time period including a time period in which an echo is generated,
wherein the control information includes operations of an active decoupling circuit to shift a resonance frequency of the radio frequency coil at a transmission timing of a radio frequency pulse and the echo-purpose communication performed during the continuous time period including the time period in which the echo is generated is performed during control of an active decoupling of the radio frequency coil.

* * * * *